United States Patent
Eisenhut et al.

(10) Patent No.: US 7,570,930 B2
(45) Date of Patent: Aug. 4, 2009

(54) AMPLIFIER ARRANGEMENT, POLAR TRANSMITTER HAVING THE AMPLIFIER ARRANGEMENT AND METHOD FOR AMPLIFYING SIGNALS

(75) Inventors: Carsten Eisenhut, Mülheim a.d. Ruhr (DE); Nenad Stevanovic, Bochum (DE); Giuseppe Li Puma, Bochum (DE)

(73) Assignee: Infineon Technologies AG, Munich (DE)

( * ) Notice: Subject to any disclaimer, the term of this patent is extended or adjusted under 35 U.S.C. 154(b) by 440 days.

(21) Appl. No.: 11/490,787

(22) Filed: Jul. 21, 2006

(65) Prior Publication Data

US 2007/0026823 A1    Feb. 1, 2007

(30) Foreign Application Priority Data

Jul. 22, 2005 (DE) .................... 10 2005 034 440

(51) Int. Cl.
  *H04B 1/04* (2006.01)
  *H01Q 11/12* (2006.01)
(52) U.S. Cl. .................... 455/114.3; 455/127.3
(58) Field of Classification Search ............. 455/114.3, 455/127.1, 127.2, 127.3; 375/296, 297; 332/144, 332/145
See application file for complete search history.

(56) References Cited

U.S. PATENT DOCUMENTS

| | | | |
|---|---|---|---|
| 7,400,865 B2* | 7/2008 | Jarvinen | 455/114.2 |
| 2005/0032488 A1* | 2/2005 | Pehlke et al. | 455/127.1 |
| 2005/0191976 A1* | 9/2005 | Shakeshaft et al. | 455/118 |
| 2008/0248766 A1* | 10/2008 | Rosnell et al. | 455/108 |

FOREIGN PATENT DOCUMENTS

DE    600 02 738 T2    4/2004

* cited by examiner

*Primary Examiner*—Nguyen Vo
(74) *Attorney, Agent, or Firm*—Eschweiler & Associates, LLC

(57) ABSTRACT

An amplifier arrangement contains a first signal input for supplying a carrier signal, a second signal input for supplying an amplitude modulation word and an amplifier stage. The amplifier stage is connected to a reference potential connection and, by means of a control connection via a means for DC signal suppression, to the first signal input. A DC voltage converter having a first connection for supplying a potential is designed to convert the potential into a supply potential, which is variable over a period of time, on the basis of a control signal, and outputs the supply potential to the second connection of the amplifier stage. In addition, the amplifier arrangement comprises a digital/analog converter which is coupled to the control connection of the amplifier stage. The input of the converter is connected to the second signal input.

21 Claims, 5 Drawing Sheets

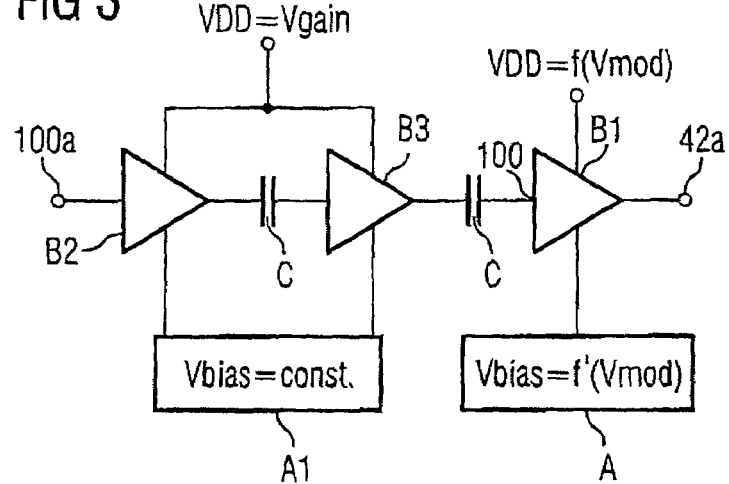
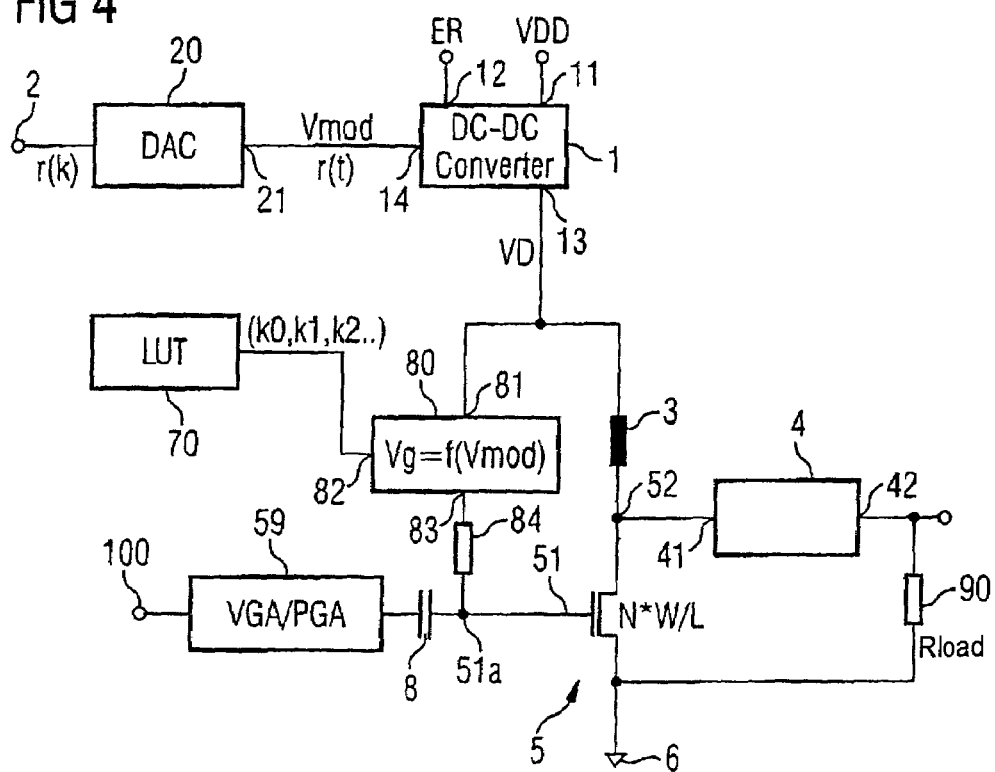

US 7,570,930 B2

AMPLIFIER ARRANGEMENT, POLAR TRANSMITTER HAVING THE AMPLIFIER ARRANGEMENT AND METHOD FOR AMPLIFYING SIGNALS

REFERENCE TO RELATED APPLICATIONS

This application claims the benefit of the priority date of German application DE 10 2005 034 440.2, filed on Jul. 22, 2005, the contents of which are herein incorporated by reference in their entirety.

FIELD OF THE INVENTION

The invention relates to an amplifier arrangement, in particular for polar transmitters. The invention also relates to a polar transmitter having an amplifier arrangement and to a method for amplifying signals.

BACKGROUND OF THE INVENTION

In many modern communications systems, the information to be transmitted is coded both in the phase and in the amplitude of a carrier signal. The combined coding of the information makes it possible to achieve considerably higher data transmission rates than in conventional types of modulation which use pure amplitude or phase modulation. Types of modulation which use pure phase modulation are referred to as types of modulation with a constant envelope (constant envelope modulation). One example of such a type of modulation is so-called frequency shift keying (FSK, GFSK) in which the information to be transmitted is coded in the form of a frequency hop or a phase shift. Examples of types of modulation using phase and amplitude modulation are, in particular, PSK (phase shift keying) modulation such as Π/4-DQPSK, 8-DPSK or 8-PSK modulation and quadrature amplitude modulation (QAM).

In contrast to analog amplitude or frequency modulation, said types of modulation are also referred to as digital types of modulation or types of modulation with a non-constant envelope. The types of modulation with a non-constant envelope are principally used in modern communications standards such as Bluetooth HDT (high data rate), GSM/EDGE, UMTS/WCDMA or WLAN.

FIG. 9 shows a constellation diagram for illustrating the transmission of data using the QPSK type of modulation. In this case, the x-axis represents a first real component I which is also referred to as an in-phase component. The y-axis forms a second complex conjugate component Q, the so-called quadrature component. Depending on its content, the information to be transmitted is coded by a value pair i, q at one of the points illustrated. Such a value pair i, q is referred to as a symbol. In the example, a symbol thus represents two bits of data content in the case of QPSK modulation. Depending on the data content to be coded, for example the bit sequence 01 11 10, the amplitudes and phases of the i and q values change over time.

In addition to a symbol being represented by a value pair i, q, it is also possible to specify the symbol in terms of its phase Φ and its amplitude r, the polar representation of the symbol. Both representations written using I/Q and r/Φ are synonymous.

In order to transmit and modulate the information onto a carrier signal, use is made, inter alia, of an I/Q modulator. FIG. 1 shows a modulator known to the inventor. In this case, the symbols which are to be transmitted and are in the form of digital in-phase and quadrature values are first converted into analog signals using a digital/analog converter and are then filtered using a low-pass filter. The continuous time values i(t), q(t) are then supplied to a respective mixer. Two signals having a phase offset of 90° with respect to one another are used as local oscillator signals, as illustrated here. Following frequency conversion by the two mixers, the converted signals are added, and amplified to the output power using the power amplifier PA, and are then output via the antenna.

When designing a transmitter output stage having the I/Q modulator illustrated, it must be ensured that there is a particularly accurate phase difference of 90° between the two local oscillator signals supplied. DC signal components in the supplied signals i(t) and q(t) are likewise converted to the transmission frequency by the mixers and may thus result in errors in the transmission of data. The illustrated I/Q modulator also consumes a relatively large amount of power on account of the two mixers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one embodiment of the invention, an amplifier arrangement comprises a first signal input for supplying a phase-modulated signal, a second signal input for supplying a digital amplitude modulation word, and an amplifier stage having a first connection to a reference potential. The amplifier stage is connected, by means of a control connection and via a means for DC signal suppression, to the first signal input. Provision is also made of a DC voltage converter which has a first connection for supplying a potential and is configured to convert the potential at its first connection into a supply potential. The DC voltage converter is connected, by means of a supply potential output, to the second connection of the amplifier stage. The amplifier arrangement also comprises a digital/analog converter having an input which is connected to the second signal input of the amplifier arrangement. An output of the digital/analog converter is connected to the control connection of the amplifier stage. The digital/analog converter is configured to convert the amplitude modulation word into an analog signal for controlling the amplifier stage.

In one embodiment, the amplitude of a carrier signal which has already been phase-modulated is modulated using the amplifier stage. The modulation is advantageously effected by supplying an amplitude-modulated supply potential to the amplifier stage. The power consumption is thus reduced in the amplifier arrangement. The amplitude-modulated supply potential is provided by the DC voltage converter. The term supply potential in at lest one example is understood as meaning the term supply voltage. In other words, modulating the supply potential also modulates the supply voltage. The terms voltage and potential are thus used synonymously in one example. A phase-modulated signal likewise also represents a frequency-modulated signal in one example.

The voltage converter has a modulation input which is connected to the digital/analog converter. The same voltage converter is configured to modulate the level of the supply potential in response to the analog signal which is supplied to the modulation input. In this case, the supply potential output of the DC voltage converter is coupled both to the second connection of the amplifier stage and to the control connection of the amplifier stage.

Amplitude modulation is thus concurrently effected at a connection of the amplifier stage and the control connection of the amplifier stage. As a result, a particularly wide dynamic range is advantageously included since the amplifier stage is now capable of operating in a switching operating mode and in the saturated region concurrently.

In one embodiment of the invention, a distortion unit is connected between the supply potential output of the DC voltage converter and the control connection of the amplifier stage. This distortion unit is configured to change and distort the supplied signal. In one embodiment, it forms an inverse transfer function as regards the supplied amplitude-modulated supply potential at the second connection of the amplifier stage.

In one embodiment of the invention, the distortion unit comprises a filter having a nonlinear transmission response. In one example, this filter may comprise filter coefficients which can be changed. In another example, the distortion unit contains a memory in which predistortion coefficients are stored. The distortion unit may likewise be configured to have a look-up table which selects coefficients from the table on the basis of a level of a supplied signal and outputs said coefficients at its output.

In another embodiment of the invention, the digital/analog converter is configured to output a current signal which has been derived from the supplied amplitude modulation word. This current signal is used to set the gain of the amplifier stage. As a result, amplitude modulation is effected, with the aid of the amplifier stages, in the current domain and no longer in the voltage domain.

This has the advantage that a particularly wide dynamic range is available for the amplitude modulation. The signal-to-noise ratio is improved, as regards amplitude modulation, with the aid of voltage signals. The amplifier arrangement specified can thus also be implemented with low supply voltages in a semiconductor body using CMOS technology. A further reduction in size to smaller dimensions in the submicron range is likewise possible.

In one embodiment of the invention, the amplifier arrangement contains a current mirror transistor which is connected, by means of a first connection, to a current source for setting its operating point. It is also coupled to the digital/analog converter for supplying a current signal from an amplitude modulation word. The control connection of the current mirror transistor is coupled to the control connection of the amplifier stage and to the first connection. The amplifier stage thus forms, together with the current mirror transistor, a current mirror, a current being applied to the current mirror transistor using the signal which is supplied by the current source and the digital/analog converter. Said current is mirrored into the amplifier stage, as a result of which the phase-modulated carrier signal which is supplied to the amplifier stage is amplitude-modulated.

In this example, it is expedient if the current mirror transistor has a similar, or advantageously identical, transmission response to an amplifier transistor of the amplifier stage. This may be achieved, for example, by means of a similar or identical design of the current mirror transistor and the amplifier transistor in the amplifier stage. This may include an identical or similar design as regards the geometrical dimensions, in particular a channel length and channel width.

One embodiment also provides a correction circuit which is configured to output a correction current to the first connection of the current mirror transistor. This makes it possible, on the one hand, to correct differences in the production process between the current mirror transistor and the amplifier transistors in the amplifier stage and, on the other hand, to also compensate for a DC voltage offset in the amplifier stage.

One embodiment of the invention provides a voltage-current converter. The output of said converter is connected to the control connection of the amplifier stage for the purpose of supplying a current signal. The input of said converter is coupled to the supply potential output of the DC voltage converter. This embodiment thus enables two-point modulation in the current domain. In this case, the modulation is effected both at the second connection of the amplifier stage and at the control connection of the latter. The signal supplied to the control connection is again in the form of a current signal. In one embodiment, the distortion unit is connected upstream of the voltage-current converter.

In order to set the gain, the amplifier stage contains, in one embodiment of the invention, a plurality of amplifier transistors which are arranged in a parallel manner. Said amplifier transistors can be switched into the signal path on the basis of a signal at a setting input. This makes it possible to set the gain in discrete steps. In one embodiment of the invention, the amplifier stage is configured for class E operation. The latter is distinguished by a switching operating behavior.

In addition to the amplifier arrangement illustrated, a polar transmitter additionally comprises a phase locked loop having an input for supplying a phase modulation word, an output and a limiting amplifier which is coupled to the output of the phase locked loop. The first signal input of the amplifier arrangement is connected to the output of the limiting amplifier.

One embodiment of the polar transmitter also provides a converting device which converts an in-phase component and a quadrature component into a phase modulation word and an amplitude modulation word. The converting device is connected, by means of the output for the phase modulation word, to the control loop and, by means of the output for the amplitude modulation word, to the second signal input of the amplifier circuit.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in detail below using the drawings and with reference to a plurality of exemplary embodiments. In this case, the exemplary embodiments illustrated are not restricted in any way. The individual features can be combined as desired without this being detrimental to the concept of the invention. In the drawings:

FIG. 3 is a block/schematic diagram illustrating an amplifier chain having an amplifier arrangement according to one embodiment of the invention, FIG. 4 is a block/schematic diagram illustrating an exemplary embodiment of the amplifier arrangement.

DETAILED DESCRIPTION OF THE INVENTION

Figure 1:
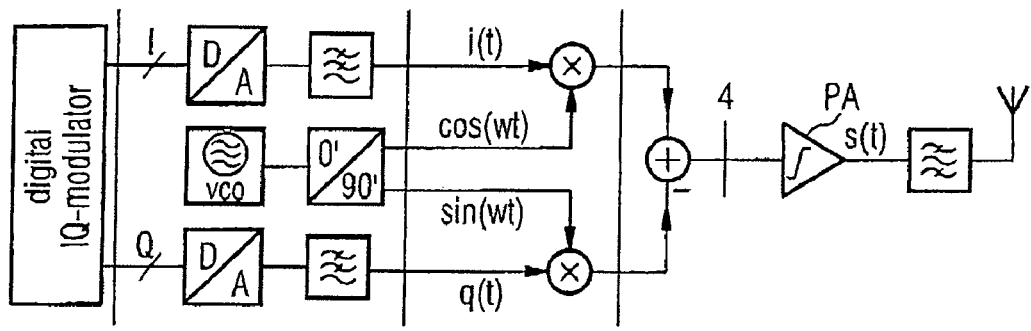
FIG. 1 is a block diagram illustrating an I/Q modulator known to the inventor.
Figure 2:
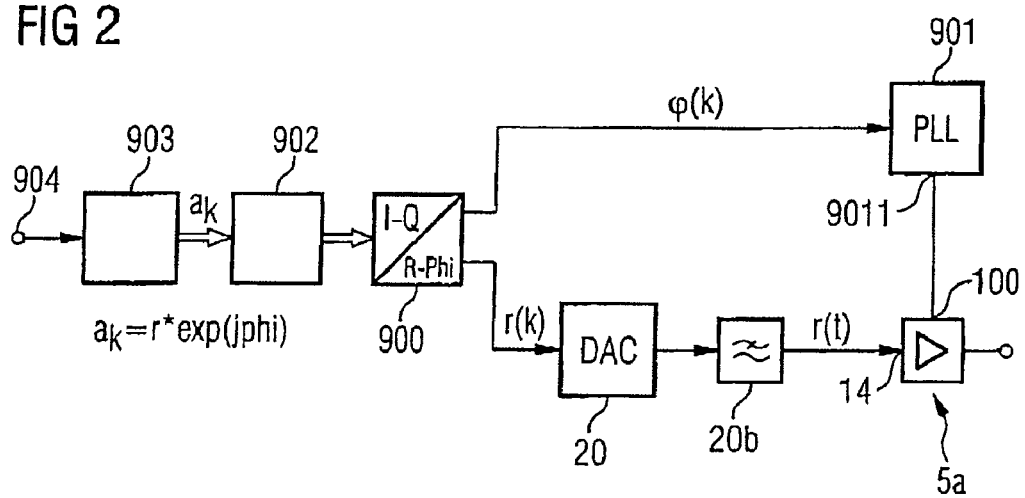
FIG. 2 is a block diagram illustrating a polar transmitter in an amplifier arrangement according to one embodiment of the invention.

FIG. 2 shows a block diagram of a polar transmitter having an amplifier circuit according to one embodiment of the invention. The polar transmitter illustrated is in the form of an integrated circuit in a semiconductor body. The information to be transmitted is supplied to the input 904 of said polar transmitter in the form of a serial bit stream. The input 904 is connected to a coder circuit 903. The latter combines the bits, which are supplied to the input 904, to form symbols, the symbols corresponding to a selected type of modulation. The latter is in turn dependent on a mobile communications standard set. The symbols which have been combined in this manner are converted, in the circuit 902, into a digital in-phase component i and a digital quadrature component q.

In addition, they are conditioned for further signal processing and their higher-order repetition spectra are suppressed. The output of the circuit 902 is connected to a converting device 900. The latter uses the digital components i and q supplied to generate an amplitude modulation word r(k) and a phase modulation word Φ(k). The amplitude and phase modulation words indicate the corresponding amplitude at the value-discrete times k. The output for the phase modulation word Φ(k) is connected to an input of a phase locked loop 901. The phase locked loop 901 uses said modulation word to generate a phase-modulated carrier signal and outputs the latter at its output 9011.

In the modulator illustrated, an amplifier (not depicted) having a limiting behavior is additionally provided at the output of the control loop. The phase-modulated signal which is output by the control loop 901 is amplified in the amplifier in such a manner that a signal in the form of a clock pulse is applied to the output. This is advantageous when using an amplifier 5a which is particularly suitable for a switching behavior. Such amplifiers are also referred to as class E amplifiers or class C amplifiers. They allow signal amplification in conjunction with a simultaneously low power consumption and good linearity.

The digital amplitude modulation word r(k) is supplied to a digital/analog converter 20. The latter uses said modulation word to generate an analog amplitude modulation word. The output of the digital/analog converter 20 is connected to a low-pass filter 20b for suppressing harmonic and higher-value components. The output of the low-pass filter is connected to an input 14 of an amplifier arrangement 5a. At the same time, the continuous time phase-modulated carrier signal is supplied to the signal input 100 of the amplifier arrangement.

The continuous time amplitude modulation signal r(t) is used to vary the gain or to change the gain setting of the arrangement 5a. The amplitude of the phase-modulated signal which is supplied to the signal input 100 is thus modulated. The amplitude modulation is effected, for example, by varying the supply voltage or the supply potential of the amplifier arrangement 5a.

In one embodiment, the amplifier stage 5a contains a plurality of individual amplifiers which are connected in series, wherein only the last amplifier stage in this chain provides amplitude modulation to the carrier signal. FIG. 3 shows a block diagram of this refinement. Three amplifier stages B2, B3 and B1 which are connected in series can be seen there. The output of the first amplifier stage B2 is connected, via a capacitor C for suppressing the DC signal component, to the input of the second amplifier stage B3. A capacitor C for suppressing the DC signal component is likewise provided between the output of the second amplifier stage B3 and the input 100 of the last amplifier stage B1. The phase-modulated carrier signal is supplied to the input 100a of the first amplifier stage B2.

In this embodiment, the supply voltage VDD and the voltage for setting the operating point of the individual amplifier transistors are selected to be constant in the stages B2 and B3. The two amplifier stages B2 and B3 have a constant gain on the basis of the constant supply voltage VDD=Vgain. The voltage for setting the operating point Vbias is selected in such a manner that the individual amplifier transistors in the stages B2 and B3 are operated in a linear region of their characteristic curve.

The actual amplitude modulation is effected using the last amplifier stage B1. In this case, as illustrated, provision is made for the supply voltage VDD to directly depend on the amplitude modulation word supplied. In this embodiment, there is direct proportional dependence between the continuous time amplitude modulation word r(t) and the supply voltage Vmod for the amplifier stage B1. In addition, in this example the voltage for setting the operating point is also derived from the amplitude-modulated supply voltage Vmod using the circuit A. The voltage operating point setting is therefore a function of the amplitude-modulated supply potential. In this embodiment of the invention, two-point modulation for changing the amplitude in the last amplifier stage B1 is therefore achieved.

In this respect, FIG. 4 shows a block diagram of one embodiment of the amplifier arrangement with a digital/analog converter connected to it. Functionally and operatively identical components have the same reference symbols.

The amplifier arrangement contains a DC voltage converter 1 having a first input 11 for supplying a potential VDD. The DC voltage converter 1 is configured to convert the potential which is applied to the input 11 into a supply potential VD and to provide it at the supply potential output 13. In this case, the magnitude of the supply potential VD provided depends on regulating signals which are supplied to the control input 12 and to the modulation input 14.

A regulating signal ER is supplied to the control input 12. To this end, the regulating signal is used, on the one hand, to activate the DC voltage converter 1 and to enable a "power ramp function". The latter is required, in particular, in systems which are based on time slots and in which the transmission power of the signal to be output is greatly increased or switched off at particular times. The transmission signals are then output in the form of pulses, the rise and fall of the pulse being controlled using the regulating signal ER.

The modulation input 14 is used to supply the analog modulation signal r(t). The latter is provided at the output 21 of the digital/analog converter 20 and is generated from the digital amplitude modulation word r(k) which is supplied to the input 2.

The amplifier arrangement additionally has an amplifier stage 5 in the form of a plurality of amplifier transistors which are arranged in a parallel manner. For a better overall view, only one of the amplifier transistors is shown here, the parallel circuit of the individual transistors being indicated by the designation N*W/L. In this case, there are N transistors which are connected in parallel, essentially have the same design and have the respective channel width W and channel length L. The channel width and channel length are a measure of the amplification properties of the transistors.

The amplifier stage 5 is connected, by means of a first connection, to the reference potential connection 6. Said amplifier stage is connected, by means of a second connection 52 and via a coil 3, to the supply potential output 13 of the DC voltage converter 1. Modulating the supply potential VD changes the supply to the amplifier stage 5 and thus the gain factor. Amplitude modulation is thus achieved in the case of a signal which is to be amplified and is supplied to the control connection 51. The coil 3 is used to suppress the radio-frequency component of the amplified signal.

The control connection 51 of the amplifier stage 5 is connected to a capacitor 8 via a node 51a. The capacitor 8 is connected to an output of a voltage-controlled amplifier or an amplifier 59 which can be adjusted using discrete values. The phase-modulated carrier signal is supplied to the input of said amplifier via the signal input 100. The capacitor 8 acts as a high-pass filter and suppresses low-frequency or DC signal components.

In the embodiment illustrated here, it is not only the supply potential at the sink connection of the amplifier stage 5 which is changed. Rather, two-point modulation is effected by simultaneously also applying the supply potential VD to the control connection 51 of the amplifier stage via a distortion unit 80 and a load 84 which is connected to the output of the latter. In detail, the distortion unit 80 has an output 83 which is connected to a resistor 84. The distortion unit 80 also additionally comprises a regulating input 82 which is supplied with different predistortion coefficients k0, k1, k2 from a memory 70, such as a look-up table.

A signal which is inverse to the supply potential VD is generated using the predistortion unit 80 and is applied to the control connection 51 of the amplifier stage 5. In this case, as illustrated here, distortion may be achieved by determining the respective levels of the supply potential in the distortion unit. On the basis of this, predistortion coefficients are read from the memory 70 and the inverse signal is generated using said coefficients.

Temporal changes, for example on account of voltage changes or temperature fluctuations, are likewise taken into account when selecting the coefficients k0, k1, k2.

In the present embodiment, the distortion unit 80 is configured in such a manner that the distorted signal $f_{Pre}$ output by it can be represented in the form of a sum of a polynomial:

$$f_{Pre}=V0+k_1*VD+k_2*VD^2+k_3*VD^3.$$

The transfer function shown for $f_{Pre}$ in this example represents a third-order polynomial. The use of such a transfer function, together with the bias potential $V_0$, allows the control connection 51 of the amplifier stage 5 to be set to an operating point which results in saturated operation during the ON phase over the entire modulation range of the modulated supply potential VD.

The output current of the amplifier transistors 5 thus remains linearly proportional to the modulated supply potential VD and thus to the amplitude modulation signal r(t) even during saturated operation.

Finally, in the embodiment of the amplifier arrangement shown in FIG. 4, the second connection 52 forms a node which is connected to an input 41 of a matching network 4. The output 42 of the matching network also forms the output 42a of the amplifier arrangement. A load 90 is connected to said output, as illustrated here. This may be an antenna, for example.

Figure 5:
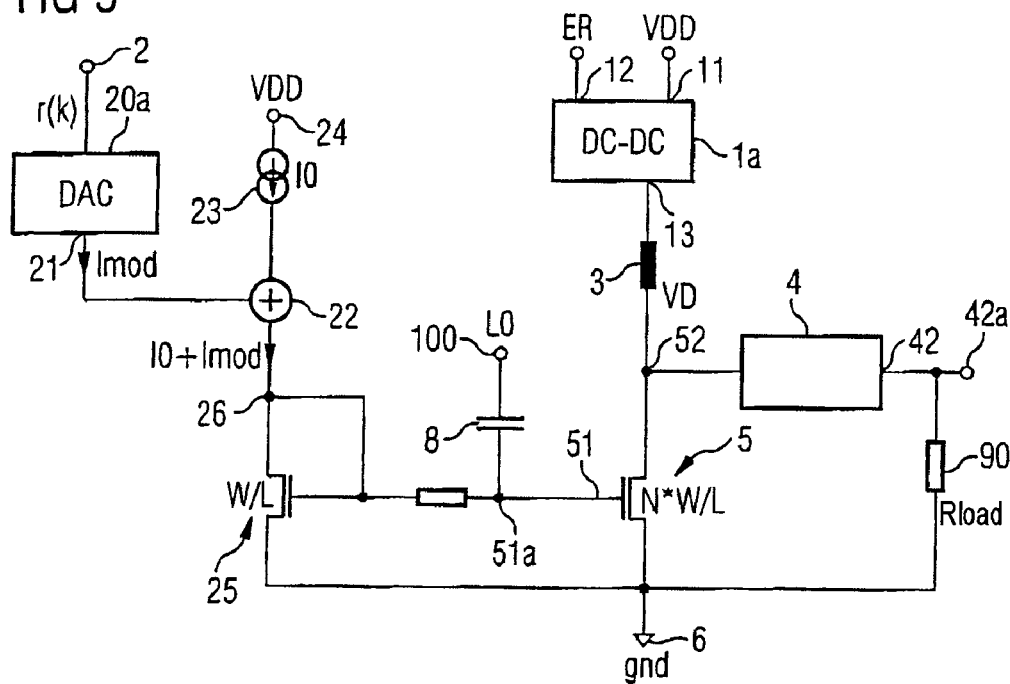
FIG. 5 is a block/schematic diagram illustrating another exemplary embodiment of the amplifier arrangement.

In addition to the possibility of achieving a sufficiently linear and simultaneously high gain within the voltage domain using the two-point modulation illustrated, it is possible to use the amplitude modulation word r(k) to modulate a current signal and to use the latter for the gain modulation. FIG. 5 shows such an embodiment. Operatively and functionally identical components have the same reference symbols in this case too.

In this exemplary embodiment, the DC voltage converter 1a is used to derive the supply potential VD from a first potential at the input 11 and to supply said supply potential to the second connection 52 of the amplifier stage 5. A sufficient supply potential is thus fed to the amplifier stage 5. The gain is modulated in this case using current modulation, in particular using a modulated current signal Imod. To this end, the amplifier arrangement contains a digital/analog converter 20a whose input is connected to the signal input 2 for supplying the digital amplitude modulation word r(k). The digital/analog converter uses the amplitude modulation word supplied to generate an analog current signal Imod. The level of the current signal Imod results from the amplitude modulation word r(k).

The amplifier stage 5 illustrated here is also configured with a current mirror. To this end, provision is made of a current mirror transistor 25 whose control connection is connected to the control connection 51 of the amplifier stage 5 via a load. The node 51a at which the phase-modulated carrier signal is applied to the control connection 51 of the amplifier stage 5 is provided between the load and the control connection 51.

The current mirror transistor is connected, by means of a connection, to the reference potential connection 6 which in this example is the ground potential GND. The second connection 26 of the current mirror transistor 25 is connected to the control connection of the latter. Said current mirror transistor is additionally connected to an adder unit 22 whose input is supplied with the amplitude-modulated current signal Imod. A second input of the adder unit 22 is connected to a current source 23. The latter is fed with the potential VDD.

The current I0+Imod flowing through the transistor is likewise applied to the amplifier stage 5 by means of the current mirror transistor 25. Modulating the current on the basis of the amplitude modulation word r(k) supplied therefore also results in the gain being modulated by the same factor in the amplifier stage 5.

In one example, the current mirror transistor 25 additionally has the same geometrical dimensions as the individual transistors of the amplifier stage 5. This is indicated here by the designation W/L. The geometrical dimensions of the amplifier stage 5 are greater, by a factor of N, than those of the current mirror transistor 25. As a result of the different geometrical dimensions, the current flowing through the individual transistors is also changed by the corresponding factor.

Figure 8:
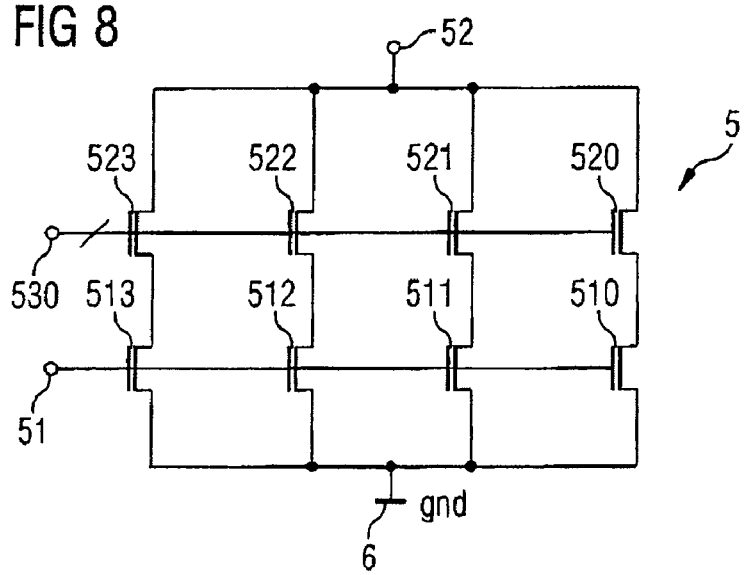
FIG. 8 is a schematic diagram illustrating an exemplary embodiment of the amplifier stage.
Figure 9:
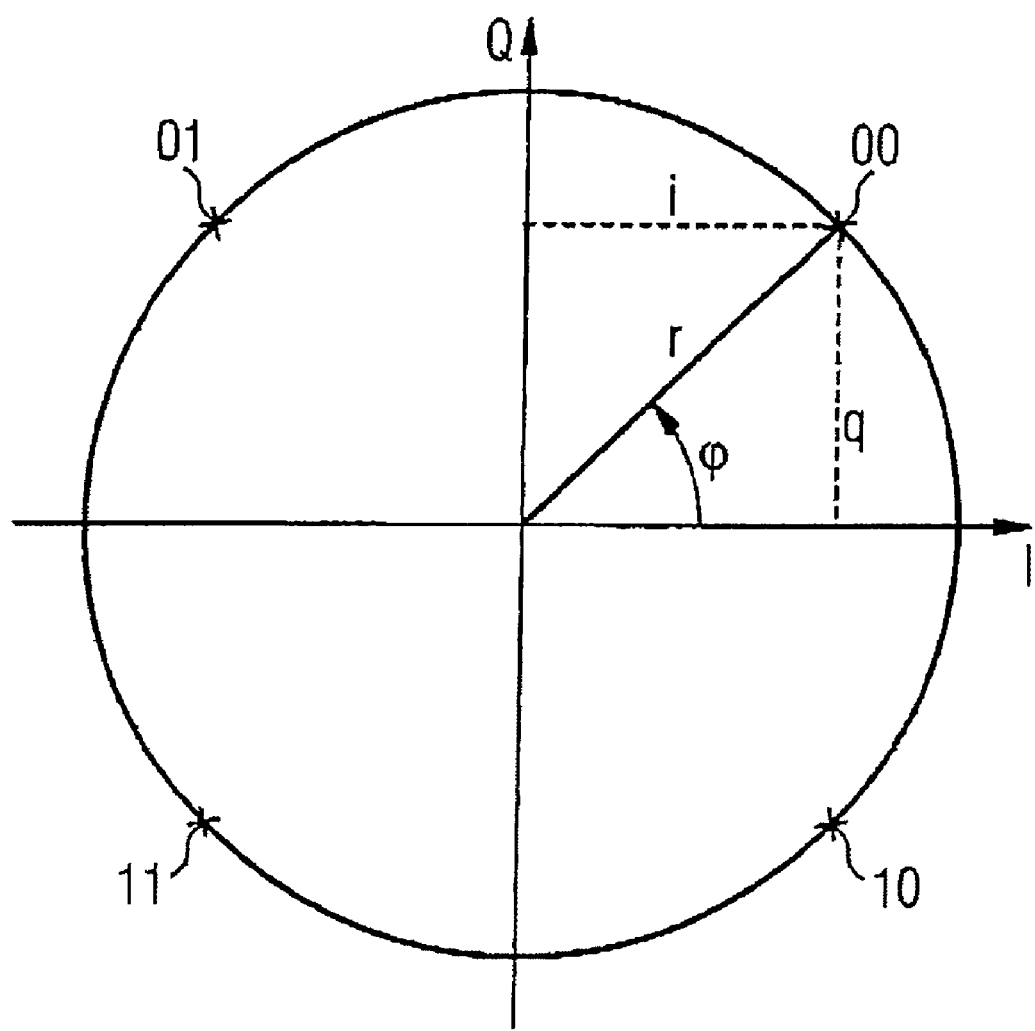
FIG. 9 is a graph illustrating a constellation diagram.

In order to improve and set the gain in a flexible manner, it is additionally possible in one embodiment to design the amplifier stage 5 with a plurality of individual amplifier transistors which are arranged in a parallel manner. Said transistors can then be switched into the corresponding signal path in order to roughly change the gain setting. FIG. 8 shows such an embodiment.

In this case, the amplifier stage 5 contains a plurality of individual amplifier transistors 510, 511, 512 and 513 which are arranged in a parallel manner. Their control connections are respectively connected to the control connection 51. The source connections are coupled to the reference potential connection 6 in order to supply the ground potential GND. In order to activate and deactivate the individual amplifier transistors 510 to 513, the respective drain connections of the transistors are connected to cascode transistors 520 to 523. The drain connections of the cascode transistors 520 to 523 simultaneously also form the second connection 52 of the amplifier stage 5. Their control connections are connected to a regulating input 530.

In the embodiment illustrated here, a value-discrete digital signal comprising four bits is supplied to the regulating input 530. This makes it possible for the individual signal paths and thus the amplifier transistors to be individually connected and disconnected. In this example, the individual amplifier transistors 510 to 513 have the respective same geometrical dimensions W/L as the current mirror transistor 25. For example, they have the same doping, the same channel length and channel width as the current mirror transistor 25. Overall, it is advantageous in one example for each of the individual amplifier transistors to have a transmission response which is in a well-defined relationship with respect to the transmission response of the current mirror transistor 25. This makes it possible to control the power in a simple manner by connecting and disconnecting individual amplifier transistors.

During operation of the circuit, the phase-modulated carrier signal LO at the input 100 is supplied to the control connection 51 of the amplifier stage 5. In this case, the phase-modulated carrier signal is configured in such a manner that it results in switching operation of the amplifier stage 5. This makes it possible to use the amplifier stage 5 in a class E operating mode.

Figure 6:
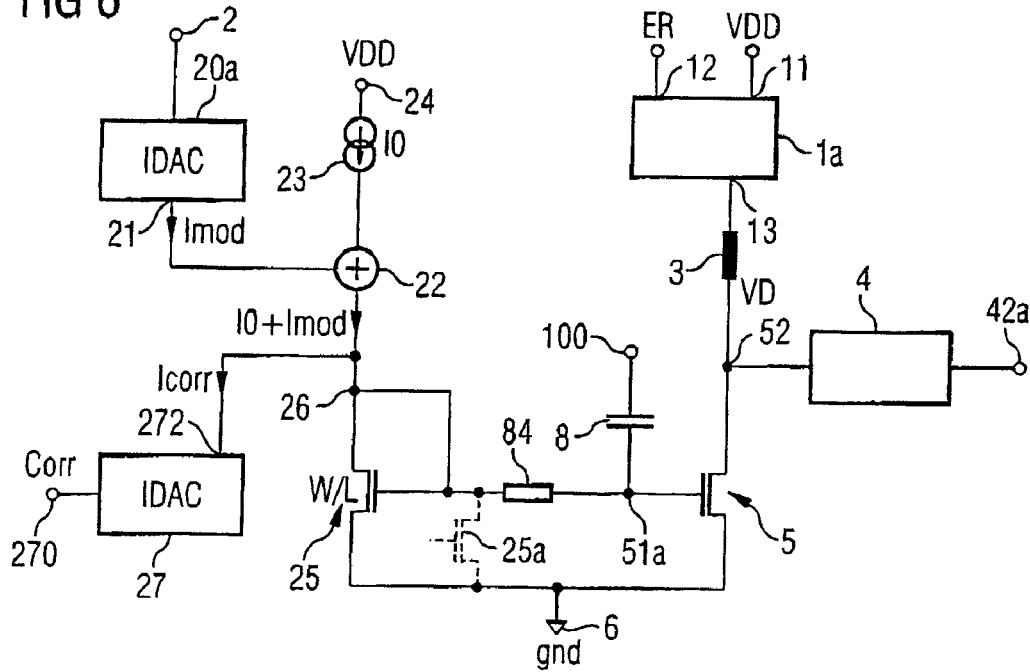
FIG. 6 is a block/schematic diagram illustrating still another exemplary embodiment of the amplifier arrangement.

FIG. 6 shows another embodiment of the invention. In this example, the fact that, in practice, additional parasitic DC signal components are often applied to the control connection of the amplifier stage 5 is taken into account. It is likewise conceivable for the current mirror transistor 25 and the transistors of the amplifier stage 5 to not be exactly identical on account of component fluctuations during the production process. These variations may be compensated for using a suitable correction current Icorr. For this purpose, as provided here, a node which is connected to the input 272 of a correction device 27 is provided between the second connection 26 and the adder 22. Said correction device generates a correction current Icorr on the basis of a correction word corr at the input 270. The correction current compensates for possible component fluctuations or an undesirable DC signal component.

In addition to the described possibility of obtaining a "power ramp function" by supplying the regulating signal ER to the regulating input 12 of the DC voltage converter 1a, a pulsed gain behavior can also be achieved or supported using the bias transistor 25a which is depicted using dashed lines. Said bias transistor is connected between the control connection of the current mirror transistor 25 and the ground potential connection 6.

Figure 7:
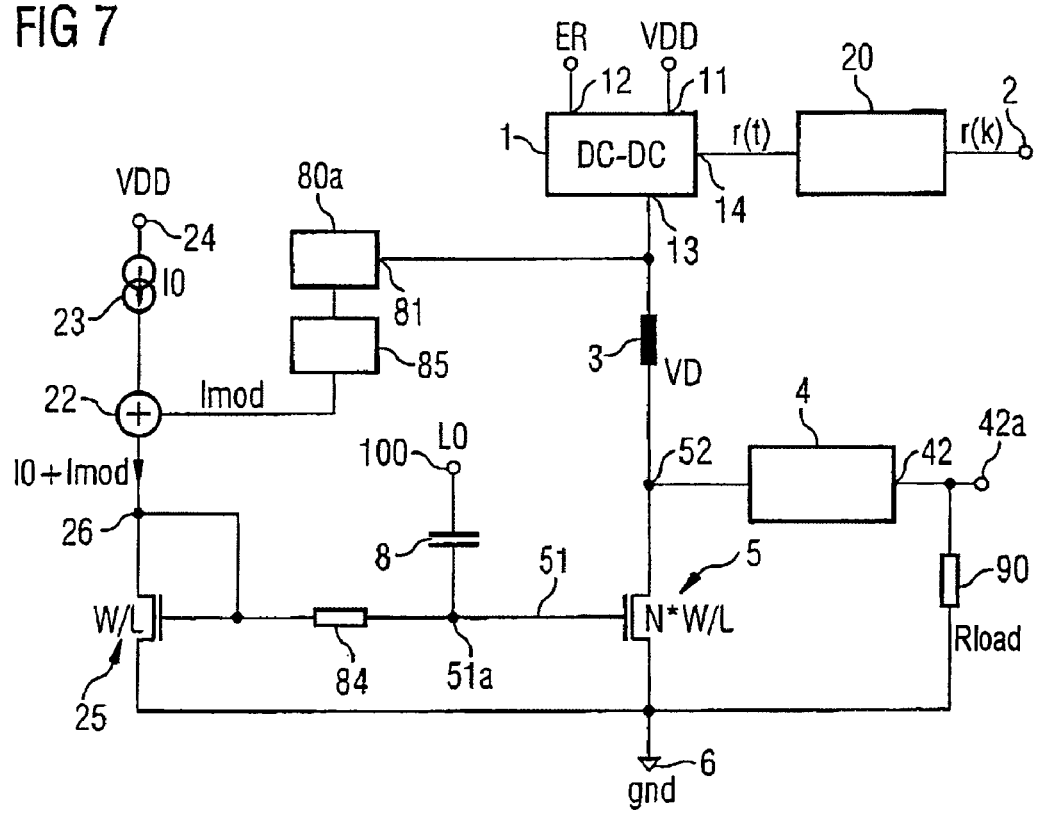
FIG. 7 is a block/schematic diagram illustrating yet another exemplary embodiment of the amplifier arrangement.

FIG. 7 shows another embodiment in which both two-point modulation and amplitude modulation are implemented using a signal current. In this case, the amplitude modulation word r(k) is converted into an amplitude modulation signal using the digital/analog converter 20 and said modulation signal is supplied to the modulation input 14 of the DC voltage converter 1. The latter uses said modulation signal to generate the amplitude-modulated supply potential VD. The supply potential VD is used, on the one hand, to supply the amplifier stage 5 at the connection 52.

On the other hand, it is used as an input signal for the distortion unit 80a which uses it to determine the inverse transfer function. The output of the distortion unit 80a is connected to a voltage/current converter 85. The latter uses the voltage signal which is supplied to it to form an amplitude-modulated predistorted current signal Imod. The output of the voltage/current converter is connected to the adder 22.

The embodiments illustrated, in particular the two-point modulation as regards amplitude modulation of the supply potential in conjunction with simultaneous modulation of a control signal at the control connection, can be used, in particular, for polar transmitters. A very wide dynamic range is covered using two-point modulation since the amplifier stage and the individual amplifier transistors operate in a switching operating mode. At the same time, the amplifier transistors are operated in a saturated mode during the ON phase of the phase-modulated signal supplied. Two-point modulation also allows a power ramp function to be carried out. As a result, a polar transmitter having the inventive amplifier arrangement is of particular interest to communications standards having systems which are based on time slots.

The design of amplitude modulation using a current signal, and thus modulation within the current domain, improves the signal-to-noise behavior. The invention makes it possible to reduce the supply voltage and to implement the amplifier arrangement in the form of a large scale integrated circuit using technologies in the submicron range. Bipolar transistors may also be used, of course, instead of the field effect transistors illustrated here. In addition to the illustrated capacitor 8 and the coil 3, other filter devices are also conceivable in order to suppress the DC signal components or radio-frequency components. The matching network 4 may also be designed, in a suitable manner, especially for class E operation. In addition to class E operation of the amplifier arrangement 5, which is of use, in particular, in the case of a switching behavior on account of the phase-modulated signal supplied, it is also possible to use amplifier stages which have other operating modes. Operation of the amplifier arrangement may depend on the input signal.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An amplifier arrangement, comprising:
 a first signal input configured to receive a phase-modulated carrier signal;
 a second signal input configured to receive a digital amplitude modulation word;

an amplifier stage comprising a first connection connected to a reference potential connection, a second connection, and a control connection connected to the first signal input via a filter configured for DC signal suppression;

a DC voltage converter comprising a first connection configured to receive a potential, and a control connection configured to receive a control signal, wherein the DC voltage converter is configured to convert the potential into a supply potential, that is variable over a period of time, based on the control signal, and output the supply potential at its output, to the second connection of the amplifier stage; and a digital/analog converter comprising an input connected to the second signal input, and an output coupled to the control connection of the amplifier stage, wherein the digital/analog converter is configured to convert the amplitude modulation word into an analog signal for controlling the amplifier stage.

2. The amplifier arrangement of claim 1, wherein the amplifier stage comprises a setting input configured to receive a setting signal for setting the gain, and wherein the amplifier stage comprises at least two amplifier transistors that are arranged in a parallel manner and can be selectively switched based on the setting signal at the setting input.

3. The amplifier arrangement of claim 2, wherein the amplifier stage further comprises a respective cascode transistor connected in series with the two amplifier transistors which are arranged in a parallel manner, wherein a control connection of each cascode transistor is connected to the setting input.

4. The amplifier arrangement of claim 1, wherein the amplifier stage is configured as a class E amplifier.

5. The amplifier arrangement of claim 1, further comprising a matching network connected to a node between the second connection of the amplifier stage and the DC voltage converter, and comprising an output forming a signal output for connection to a load.

6. The amplifier arrangement of claim 1, wherein the output of the digital/analog converter is connected to a modulation input of the DC voltage converter, and wherein the DC voltage converter is configured to modulate the level of the supply potential in response to the analog signal supplied to the modulation input, and wherein the supply potential output of the DC voltage converter is coupled to the second connection and to the control connection of the amplifier stage.

7. The amplifier arrangement of claim 1, further comprising a distortion unit connected between the supply potential output of the DC voltage converter and the control connection of the amplifier stage, wherein the distortion unit is configured to change the supply potential in response to coefficients which are supplied to the distortion unit.

8. The amplifier arrangement of claim 7, wherein the distortion unit comprises a filter having a nonlinear transmission response.

9. The amplifier arrangement of claim 7, wherein the distortion unit comprises a memory in which coefficients are stored.

10. The amplifier arrangement of claim 1, wherein the digital/analog converter is configured to output a current signal derived from the supplied amplitude modulation word.

11. The amplifier arrangement of claim 1, further comprising a current mirror transistor connected, by means of a first connection, to a current source configured to set an operating point and to the digital/analog converter to supply thereto a current signal derived from the supplied amplitude modulation word, wherein a control connection of the current mirror transistor is coupled to the control connection of the amplifier stage and to the first connection.

12. The amplifier arrangement of claim 11, wherein the current mirror transistor has substantially the same transmission response as an amplifier transistor of the amplifier stage.

13. The amplifier arrangement of claim 11, wherein the current mirror transistor corresponds to an amplifier transistor in the amplifier stage.

14. The amplifier arrangement of claim 11, further comprising a correction circuit configured to output a correction current to the first connection of the current mirror transistor.

15. The amplifier arrangement of claim 1, further comprising a voltage-current converter comprising an output coupled to the control connection of the amplifier stage, and an input coupled to the supply potential output of the DC voltage converter.

16. The amplifier arrangement of claim 1, further comprising a low-pass filter connected downstream of the output of the digital/analog converter.

17. The amplifier arrangement of claim 1, in combination with a phase locked loop comprising an input configured to receive a phase modulation word, wherein the phase locked loop is configured to change a frequency of a carrier signal in response to the phase modulation word, thereby providing a phase modulated carrier signal at an output thereat, and wherein the output of the phase locked loop is connected to the first signal input of the amplifier arrangement.

18. The amplifier arrangement of claim 17, further comprising a converting device configured to convert a digital in-phase component and a digital quadrature component into the phase modulation word and an amplitude modulation word, wherein the converting device is connected to the amplifier arrangement and to the phase locked loop.

19. A method for amplifying signals, comprising:
providing a signal to be amplified;
converting a digital amplitude modulation word into an analog modulation signal;
generating a modulated supply potential from a potential in response to the analog modulation signal and based on a supplied control signal;
generating a setting signal from the modulated supply potential; and
amplifying the signal to be amplified by concurrently setting an operating point of an amplifier using the setting signal and supplying the modulated supply potential to the amplifier.

20. The method of claim 19, wherein, before amplification, the setting signal is distorted based on supplied coefficients.

21. The method of claim 19, wherein generating the setting signal comprises:
generating a current signal based on the analog modulation word; and
mirroring the current signal in order to control the amplifier.

* * * * *